(12) United States Patent
Pons et al.

(10) Patent No.: US 8,677,226 B2
(45) Date of Patent: Mar. 18, 2014

(54) SYSTEMS AND METHODS FOR RETRANSMISSION RETURN CHANNEL ERROR DETECTION

(75) Inventors: Julien D. Pons, Eatontown, NJ (US); Laurent Francis Alloin, Monmouth Beach, NJ (US); Massimo Sorbara, Freehold, NJ (US); Vinod Venkatesan, Edison, NJ (US)

(73) Assignee: Ikanos Communications, Inc., Fremont, CA (US)

(*) Notice: Subject to any disclaimer, the term of this patent is extended or adjusted under 35 U.S.C. 154(b) by 339 days.

(21) Appl. No.: 12/728,758

(22) Filed: Mar. 22, 2010

(65) Prior Publication Data

US 2010/0281349 A1 Nov. 4, 2010

Related U.S. Application Data

(60) Provisional application No. 61/175,351, filed on May 4, 2009, provisional application No. 61/175,758, filed on May 5, 2009, provisional application No. 61/178,039, filed on May 13, 2009, provisional application No. 61/220,970, filed on Jun. 26, 2009.

(51) Int. Cl.
 *G06F 11/10* (2006.01)
(52) U.S. Cl.
 USPC .......................................... 714/801; 375/340
(58) Field of Classification Search
 USPC ........... 714/801, 807, 799, E11.032; 375/340
 See application file for complete search history.

(56) References Cited

U.S. PATENT DOCUMENTS

| | | | | |
|---|---|---|---|---|
| 4,745,269 | A * | 5/1988 | Van Gils | 235/487 |
| 5,968,199 | A | 10/1999 | Khayrallah et al. | |
| 6,598,200 | B1 * | 7/2003 | Greenwood et al. | 714/774 |
| 6,671,327 | B1 * | 12/2003 | Jin | 375/265 |
| 7,205,912 | B1 * | 4/2007 | Yang et al. | 341/59 |
| 7,669,104 | B2 * | 2/2010 | Uchida et al. | 714/755 |
| 2006/0159195 | A1 * | 7/2006 | Ionescu et al. | 375/267 |
| 2007/0248151 | A1 * | 10/2007 | Kim et al. | 375/148 |
| 2007/0300126 | A1 * | 12/2007 | Nakao et al. | 714/758 |

(Continued)

FOREIGN PATENT DOCUMENTS

| | | |
|---|---|---|
| JP | H08139614 (A) | 5/1996 |
| JP | 2001506447 (A) | 5/2001 |

(Continued)

OTHER PUBLICATIONS

International Search Report and Written Opinion, date of mailing Jun. 9, 2010.

*Primary Examiner* — Ajay Bhatia
*Assistant Examiner* — Thien D Nguyen
(74) *Attorney, Agent, or Firm* — Pillsbury Winthrop Shaw Pittman LLP

(57) ABSTRACT

A method implemented in a digital subscriber line (DSL) system is described for minimizing a misdetection probability at a far-end coded message receiver during transmission of a coded message. The method comprises jointly determining, at the far-end coded message receiver, a P matrix and a modulation scheme. The method further comprises encoding a message into a coded message with a systematic linear block code, the systematic linear block code having a generator matrix [I P], where I represents a linear block code component identity matrix and P represents the determined P matrix. The method also comprises modulating the encoded message to one or more tones forming a discrete multi-tone (DMT) symbol according to the determined modulation scheme.

22 Claims, 10 Drawing Sheets

(56) References Cited

U.S. PATENT DOCUMENTS

| | | | |
|---|---|---|---|
| 2008/0062872 A1* | 3/2008 | Christiaens et al. | 370/231 |
| 2009/0034637 A1* | 2/2009 | Hoshino et al. | 375/260 |
| 2009/0046568 A1* | 2/2009 | Xu | 370/201 |
| 2009/0204877 A1* | 8/2009 | Betts | 714/806 |
| 2009/0282312 A1* | 11/2009 | Liu | 714/751 |
| 2009/0307562 A1* | 12/2009 | Lee et al. | 714/758 |

FOREIGN PATENT DOCUMENTS

| | | |
|---|---|---|
| WO | WO2007/091797 | 8/2007 |
| WO | WO 2007/134030 A2 | 11/2007 |
| WO | WO 2008/024967 A2 | 2/2008 |

* cited by examiner

SYSTEMS AND METHODS FOR RETRANSMISSION RETURN CHANNEL ERROR DETECTION

CROSS-REFERENCE TO RELATED APPLICATION

This application claims priority to and the benefit of U.S. Provisional Patent Application entitled, "Systems and Methods for Retransmission Return Channel Error Detection," having Ser. No. 61/175,351, filed on May 4, 2009, which is incorporated by reference in its entirety. This application also claims priority to and the benefit of U.S. Provisional Patent Application entitled, "Systems and Methods for Retransmission Return Channel Error Detection," having Ser. No. 61/175,758, filed on May 5, 2009, which is incorporated by reference in its entirety. This application also claims priority to and the benefit of U.S. Provisional Patent Application entitled, "Systems and Methods for Retransmission Return Channel Error Detection," having Ser. No. 61/178,039, filed on May 13, 2009, which is incorporated by reference in its entirety. This application also claims priority to and the benefit of U.S. Provisional Patent Application entitled, "Systems and Methods for Retransmission Return Channel Error Detection," having Ser. No. 61/220,970, filed on Jun. 26, 2009, which is incorporated by reference in its entirety.

TECHNICAL FIELD

The present disclosure generally relates to digital subscriber line (DSL) systems and specifically, to systems and methods for retransmission return channel error detection.

BACKGROUND

In asymmetric digital subscriber line (ADSL) and very high speed digital subscriber line (VDSL) systems, retransmission (ReTx) can be optionally utilized for ensuring quality of transmission for latency-insensitive data, such as video. Techniques for performing retransmission are provided in the G.inp recommendation. The retransmission scheme used in xDSL systems supports both asynchronous transfer mode (ATM) and packet transfer mode (PTM) protocols and has been designed such that elementary frames that can be retransmitted are formed in the physical layer (PHY). Generally, for ADSL systems, it has been proposed that retransmission be implemented only in the downstream direction, whereas for VDSL systems, retransmission may either be implemented in strictly the downstream direction or in both the downstream and upstream directions.

Generally, a transmitter that supports a retransmission scheme includes a retransmission queue for storing elementary frames in order to have access to previously-sent elementary frames in the event that a request for retransmission is received. A request for retransmission is contained in a retransmission return channel (RRC) message, which contains information on which elementary frames have been incorrectly received, and hence need to be retransmitted. RRC messages are transported over the retransmission return channel. A receiver that supports retransmission will typically include a frame error detector, a rescheduling queue, and a retransmission request encoder. The frame error detector detects the correctness of each received frame. The rescheduling queue re-sequences elementary frames in the event that correctly received elementary frames are received out of order due to retransmission. The request encoder converts the decisions of the frame error detector into a RRC message, which can be understood by the transmitter side.

For improved robustness during transmission over the retransmission return channel, the request information may be encoded. Encoding, also referred to as coding, involves adding redundancy to the original message. Encoding the RRC message at the receiver side may involve some decoding capability at the transmitter side in order to be correctly interpreted by the system. One technique for encoding the redundancy bits of the RRC message has been proposed in the G.inp recommendation. Thus far, the use of a (24, 12) extended Golay code and the use of a 12 bit cyclic redundancy check (CRC-12) have been proposed to encode the 12 bits of the raw RRC message. However, questions remain regarding which code performs most effectively for G.inp environments as a number of perceived shortcomings involving current approaches to utilizing a (24, 12) Golay code and a 12-bit cyclic redundancy check (CRC-12) exist.

SUMMARY

One embodiment, among others, is a system that comprises a transmitter for transmitting a coded message to a far-end coded message receiver. The transmitter comprises an encoder configured to encode a message into a coded message with a systematic linear block code. The systematic linear block code has a generator matrix [I P], where I represents a linear block code component identity matrix and P represents a P matrix that specifies redundancy bits. The transmitter further comprises a modulator configured to modulate the encoded message to one or more tones forming a discrete multi-tone (DMT) symbol, wherein the linear block code component P matrix and modulation scheme are jointly determined to minimize a misdetection probability at the far-end coded message receiver.

Another embodiment is a system that comprises a receiver for receiving a coded message from a far-end coded message transmitter. The receiver comprises an error detector configured to determine a level of correctness of the received message encoded with a systematic linear block code. The systematic linear block code has a generator matrix [I P], where I represents a linear block code component identity matrix and P represents a P matrix that specifies redundancy bits. The receiver further comprises a demodulator configured to demodulate the encoded message from one or more tones forming a discrete multi-tone (DMT) symbol. The receiver is further configured to transmit modulation information associated with the coded message to the far-end message transmitter and jointly determines the linear block code component P matrix and modulation information to minimize a misdetection probability.

Another embodiment is a system for transmitting a 24-bit coded message to a far-end coded message receiver. The system comprises an encoder configured to encode a 12-bit message into a 24-bit coded message with a (24, 12) systematic linear block code. The systematic linear block code has a generator matrix [I P], where I represents a linear block code component identity matrix and P represents a P matrix that specifies redundancy bits. Furthermore, the linear block code component identity matrix I is a 12*12 identity matrix, and the component P matrix is $$P = \begin{bmatrix} 1 & 0 & 1 & 1 & 1 & 0 & 1 & 1 & 0 & 1 & 0 & 0 \\ 1 & 0 & 1 & 1 & 0 & 1 & 0 & 0 & 1 & 1 & 1 & 0 \\ 0 & 1 & 1 & 1 & 1 & 0 & 0 & 1 & 1 & 0 & 1 & 0 \\ 0 & 1 & 1 & 1 & 0 & 0 & 1 & 0 & 1 & 1 & 0 & 1 \\ 0 & 1 & 0 & 0 & 0 & 1 & 0 & 1 & 1 & 1 & 1 & 1 \\ 1 & 1 & 0 & 1 & 1 & 0 & 0 & 0 & 0 & 1 & 1 & 1 \\ 1 & 0 & 0 & 1 & 0 & 0 & 1 & 1 & 1 & 0 & 1 & 1 \\ 1 & 1 & 1 & 0 & 0 & 1 & 1 & 1 & 1 & 0 & 0 & 0 \\ 0 & 1 & 0 & 1 & 1 & 1 & 1 & 0 & 0 & 0 & 0 & 1 \\ 1 & 0 & 0 & 0 & 1 & 1 & 1 & 0 & 1 & 1 & 0 & 1 \\ 0 & 1 & 1 & 0 & 1 & 1 & 1 & 0 & 0 & 1 & 1 & 0 \\ 1 & 0 & 1 & 0 & 1 & 1 & 0 & 1 & 0 & 0 & 1 & 1 \end{bmatrix}.$$

Another embodiment is system for receiving a 24-bit coded message from a far-end coded message transmitter. The system comprises a detector configured to determine a level of correctness of the received 24-bit coded message, wherein the received 24-bit coded message is encoded with a (24, 12) systematic linear block code. The systematic linear block code has a generator matrix [I P], where I represents a linear block code component identity matrix and P represents a P matrix that specifies redundancy bits. The linear block code component identity matrix I is a 12*12 identity matrix, and the component P matrix is $$P = \begin{bmatrix} 1 & 0 & 1 & 1 & 1 & 0 & 1 & 1 & 0 & 1 & 0 & 0 \\ 1 & 0 & 1 & 1 & 0 & 1 & 0 & 0 & 1 & 1 & 1 & 0 \\ 0 & 1 & 1 & 1 & 1 & 0 & 0 & 1 & 1 & 0 & 1 & 0 \\ 0 & 1 & 1 & 1 & 0 & 0 & 1 & 0 & 1 & 1 & 0 & 1 \\ 0 & 1 & 0 & 0 & 0 & 1 & 0 & 1 & 1 & 1 & 1 & 1 \\ 1 & 1 & 0 & 1 & 1 & 0 & 0 & 0 & 0 & 1 & 1 & 1 \\ 1 & 0 & 0 & 1 & 0 & 0 & 1 & 1 & 1 & 0 & 1 & 1 \\ 1 & 1 & 1 & 0 & 0 & 1 & 1 & 1 & 1 & 0 & 0 & 0 \\ 0 & 1 & 0 & 1 & 1 & 1 & 1 & 0 & 0 & 0 & 0 & 1 \\ 1 & 0 & 0 & 0 & 1 & 1 & 1 & 0 & 1 & 1 & 0 & 1 \\ 0 & 1 & 1 & 0 & 1 & 1 & 1 & 0 & 0 & 1 & 1 & 0 \\ 1 & 0 & 1 & 0 & 1 & 1 & 0 & 1 & 0 & 0 & 1 & 1 \end{bmatrix}.$$

Another embodiment is a method implemented in a digital subscriber line (DSL) system for minimizing a misdetection probability at a far-end coded message receiver during transmission of a coded message. The method comprises jointly determining, at the far-end coded message receiver, a P matrix and a modulation scheme. The method further comprises encoding a message into a coded message with a systematic linear block code, the systematic linear block code having a generator matrix [I P], where I represents a linear block code component identity matrix and P represents the determined P matrix. The method also comprises modulating the encoded message to one or more tones forming a discrete multi-tone (DMT) symbol according to the determined modulation scheme.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
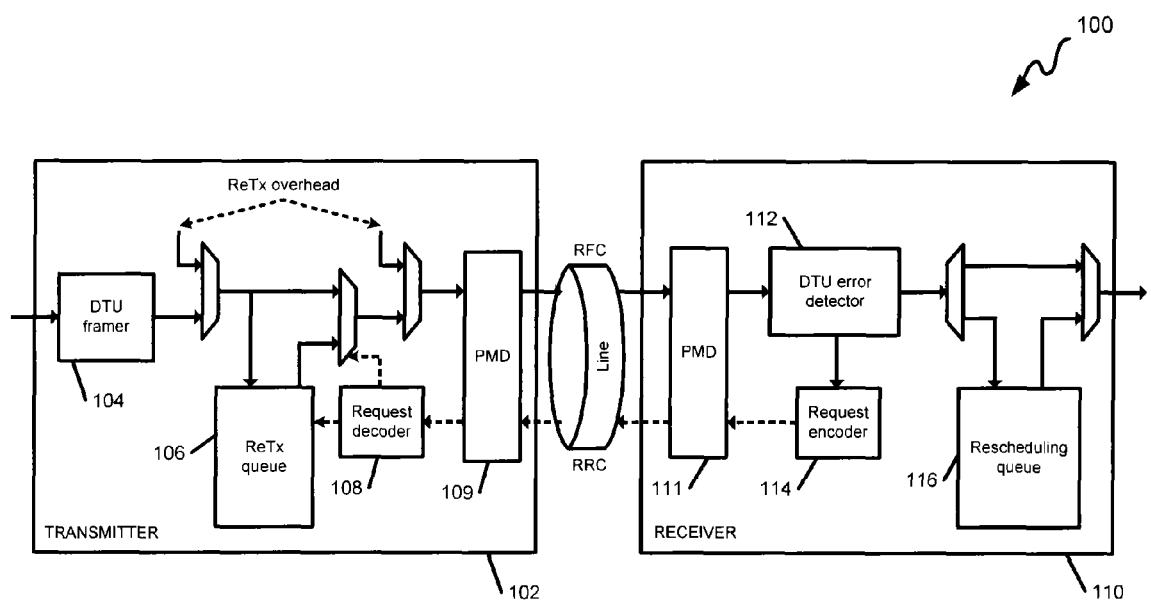
FIG. 1 depicts a functional block diagram of an embodiment for a single link retransmission system.

Having summarized various aspects of the present disclosure, reference will now be made in detail to the description of the disclosure as illustrated in the drawings. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Various embodiments are described that incorporate a rate ½ systematic linear block code as an error detection mechanism in the RRC message to address performance issues relating to use of the Golay code and CRC-12 for error detection in the RRC channel. For some embodiments, the desired linear block code P matrix is determined by the RRC channel receiver and communicated to the RRC transmitter during initialization. In other embodiments, the RRC transmitter determines the P matrix following the exchange of information regarding the receiver configuration during initialization. Linear block code P matrix values are described that are communicated from the RRC receiver to the RRC transmitter during initialization, or determined prior to initialization. To avoid transmitting the entire P matrix, a special message identifier is incorporated for some embodiments, where the special message identifier is used for selecting pre-stored P matrices for Golay code, CRC-12 and/or other error correction codes.

Reference is made to FIG. 1, which depicts a functional block diagram of a single link retransmission system 100 in which embodiments of retransmission return channel error detection may be implemented. The system 100 comprises a transmitter 102, which comprises a DTU framer 104 configured to construct elementary frames, called data transmit units (DTUs) that can be requested for retransmission. Each DTU contains data provided by the transport protocol specific transmission convergence (TPS-TC) layer and retransmission (ReTx) specific overhead, which is described in more detail below. The content of each DTU is stored in a retransmission (ReTx) queue 106 prior to being sent to a physical medium specific (PMD) layer 109, and then transmitted over the retransmission forward channel (RFC), which is represented by the solid arrow path in FIG. 1.

The storage of a DTU comprises storing at least the data content of the DTU as well as some or all ReTx specific overhead bytes. The transmitter 102 also receives request messages on a retransmission return channel (RRC) represented by the dashed arrow path in FIG. 1. The received request messages, also called RRC messages, contain information as to which DTUs have been correctly received and which DTUs need to be retransmitted. For improved robustness during transmission over the RCC, the request information may be coded in a specific format with a request encoder 114. Note that the request information may need to undergo decoding with a request decoder 108 in order to be correctly interpreted by the system 100.

At the receiver side 110, each DTU is checked for errors after reception at a DTU error detector 112. Correct DTUs are then passed to a higher layer. When a DTU is corrupted, a request for retransmission is generated by a request encoder 114 and sent on the RRC. When a retransmission is in progress, correctly received DTUs may be stored locally in a rescheduling queue 116 before being passed to a higher layer. Such storage ensures a correct ordering of the data passed to the higher layer. The rescheduling queue 116 then acts as a buffer that reschedules or re-sequences DTUs received out-of-sequence. At the transmitter side 102, the PMD layer 109 modulates data sent over the RFC and demodulates data received from the RRC. At the receiver side 110, the PMD layer 111 demodulates data received from the RFC and modulates data sent over the RRC.

Figure 2:
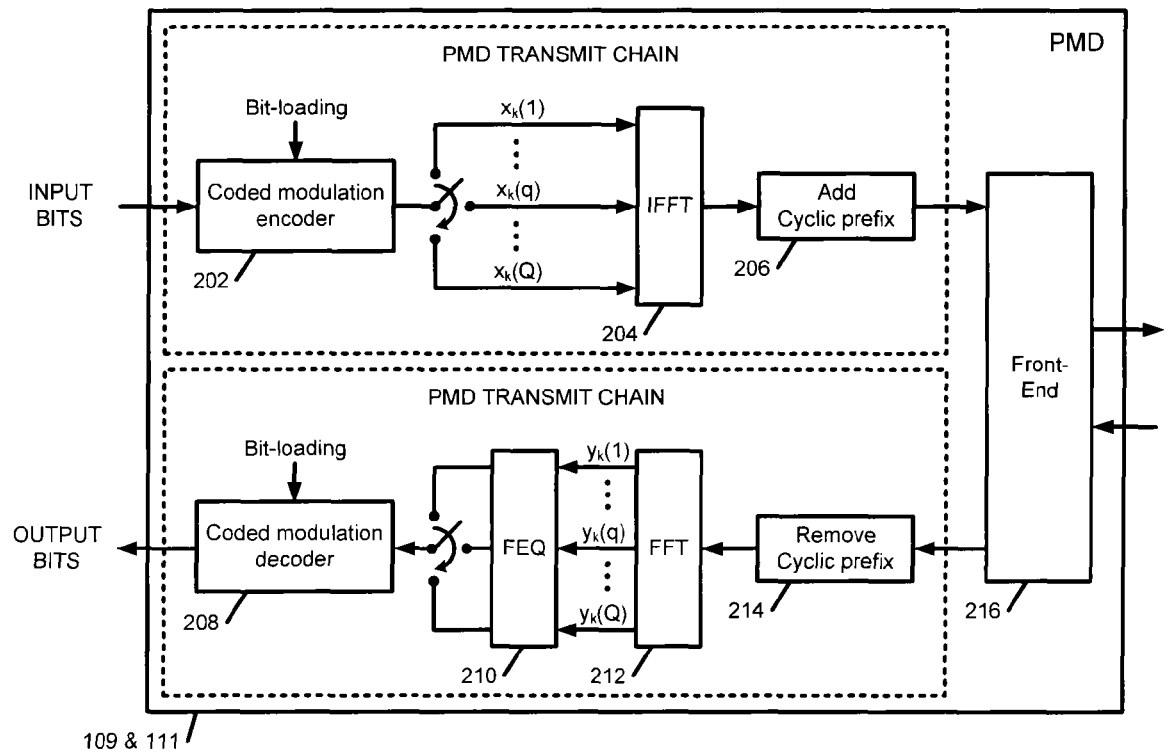
FIG. 2, which illustrates the modulation and demodulation performed in the physical medium specific (PMD) layer of FIG. 1.

Reference is now made to FIG. 2, which illustrates the modulation and demodulation performed in the PMD layer 109, 111, commonly referred to as discrete multi-tone (DMT) modulation and demodulation. In DMT modulation, the input bits of the PMD layer 109, 111 are encoded by an inner coded modulation scheme into amplitude and phase information signals $x_k(q)$ (i.e., complex numbers taken from a finite size 2-dimensional constellation) alternately carried over the subcarrier frequency band, also referred to as the tone, specified by the index q in the integer set $\{1, 2, \ldots, Q\}$. The number Nq of bits mapped to $x_k(q)x_k(q)$ depends on the transmission quality relative to the tone q, and is dictated by a bit-loading algorithm. For improved performance, the inner coded modulation output bits are not necessarily mapped to tones with contiguous indices q. The tone indices may be interleaved with a pattern dictated by the tone interleaving algorithm. The "modulation information" formed by the combination of the bit loading and tone interleaving information, which may comprise "bit-to-tone" loading information, is exchanged between the DSL transceivers at initialization. At the coded modulation scheme output, each block of Q contiguous complex signals $x_k(1), \ldots, x_k(Q)$ forms a frequency-domain DMT symbol of index k, which is transformed via an IFFT (inverse fast Fourier transform) block 204 into a discrete time sequence. A cyclic prefix adder 206 then adds a cyclic prefix, also referred to as guard interval, to the output of the IFFT block 204 to improve robustness to inter symbol interference. Finally, a front-end device 216 transforms the discrete time sequence into a continuous time signal sent to the channel. The processing done in the front-end device 216 typically combines both digital and analog domain processing.

Figure 3A:
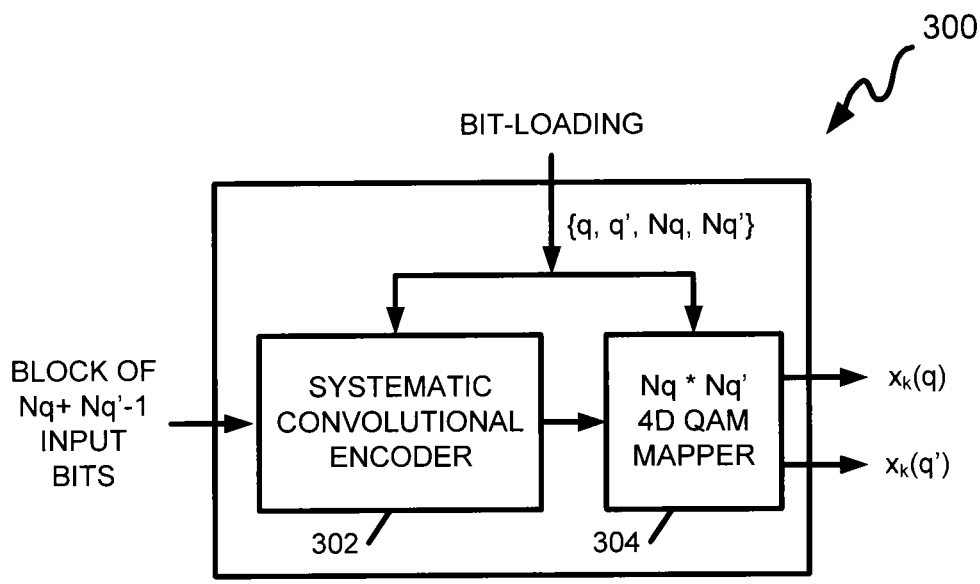
FIG. 3A shows a trellis coded modulation (TCM) encoder.

In DMT demodulation, the front-end device 216 receives time domain samples from the channel. After cyclic prefix removal at the cyclic prefix remover 214, the signal is forwarded to a FFT (fast Fourier transform) block 212. For each received DMT symbol of index k, the FFT block 212 outputs a complex information $y_k(q)$ per tone q for all q in the integer set $\{1, 2, \ldots, Q\}$. The information $y_k(q)$ is then equalized by the frequency domain equalizer (FEQ) block 210, which typically processes independently each tone using a one-tap complex equalizer, and then feeds the signal to a coded modulation decoder 208 for the inner coded modulation scheme. The decoder 208 output contains a decision on the bits that constitute the PMD 109, 111 output. The coded modulation scheme typically used in xDSL systems is a four-dimensional (4D) 16-state Wei trellis coded modulation (TCM) scheme. The TCM encoder 300 is depicted in FIG. 3A, and for some embodiments, comprises a rate (Nq+Nq'−1)/(Nq+Nq') 16-state systematic convolutional encoder device 302 and an Nq*Nq' 4D quadrature amplitude modulation (QAM) constellation mapper device 304. The 4D QAM mapper 304 generates a 4D signal formed by two 2D QAM signals $x_k(q)$ and $x_k(q')$ that are mapped to a pair of tones $\{q,q'\}$. Note that the tones q and q' are not necessarily contiguous, as the mapping of 2D QAM signals to tones may be interleaved for improved performance. The signals $x_k(q)$ and $x_k(q')$ contain respectively Nq and Nq' bits, i.e., are taken from a 2D QAM constellation with $2^{Nq}$ and $2^{Nq'}$ possible points, respectively. The values of Nq and Nq' depend on the output of the bit-loading algorithm, may take any integer value from 1 to 15, and may change from one 4D signal to another.

Figure 3B:
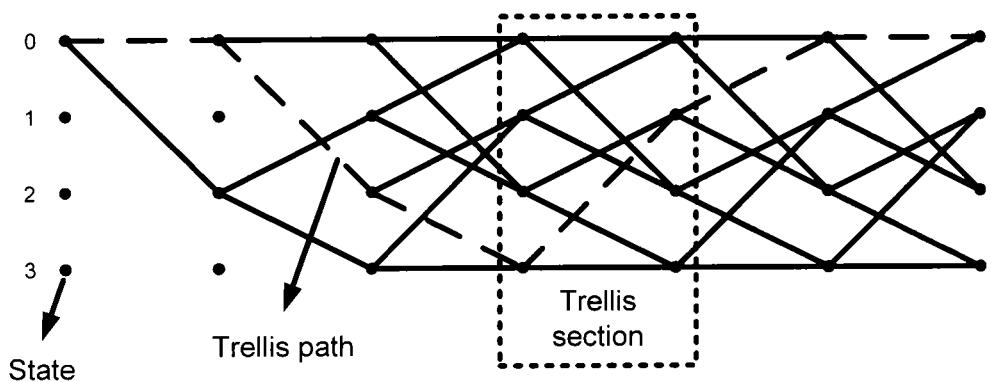
FIG. 3B illustrates the trellis diagram of the encoding process by a 4-state encoder.
Figure 4:
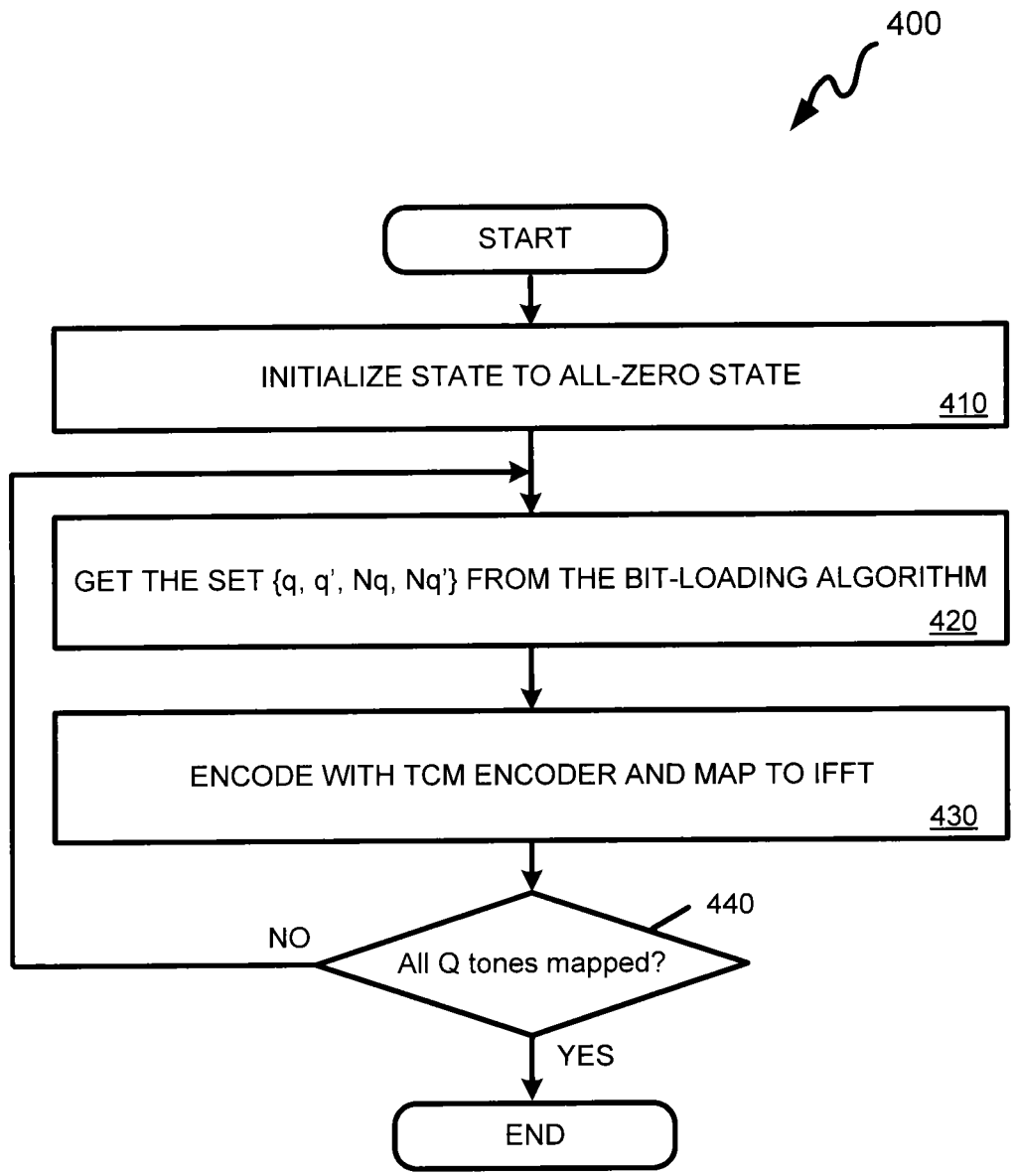
FIG. 4 illustrates a flow chart for a TCM encoding procedure for a discrete multi-tone (DMT) symbol.

The encoding process is generally represented by a trellis diagram, as seen in FIG. 3B for a 4-state encoder, in which each trellis section represents the transition from one state to another, the transition being decided by the particular combination of the Nq+Nq'−1 input bits. Each new set of Nq+Nq'−1 input bits leads to a transition to the next section in the trellis diagram. A TCM encoding process 400 for a DMT symbol is shown in FIG. 4 and involves the following. Beginning with block 410, the convolutional encoder state is initialized to an all-zero state. The first set $\{q,q',Nq,Nq'\}$ is then derived from the bit-loading algorithm and Nq+Nq'−1 bits are fetched from the encoder input and encoded. In block 420, the next set $\{q,q',Nq,Nq'\}$ is derived from the bit-loading algorithm and Nq+Nq'−1 new bits are fetched from the encoder input and encoded (block 430). The process is continued until all the tones of a DMT symbol (i.e., until all values between 1 and Q have been taken either by q or q') are mapped (decision block 440). Note that the last bits of the encoder input can be set to a value that forces the encoder state to reach an all-zero state, thereby improving the TCM decoding performance and automatically reinitializes the state for the next DMT symbol.

For some embodiment, the decoding algorithm for the TCM code can be based on the Viterbi algorithm, The Viterbi algorithm searches the trellis diagram for the most likely path to have been generated by the input sequence. Note that when the encoder is initialized to a known state (say all-zero state), the number of possible transitions to in the first sections of the trellis diagram is reduced (as shown on the left-end side of FIG. 3B). Therefore, knowing the starting state reduces the number of possible trellis branches to search with the Viterbi algorithm, thereby reducing the probability of decision error for the bits mapped to the associate sections.

Figure 5A:
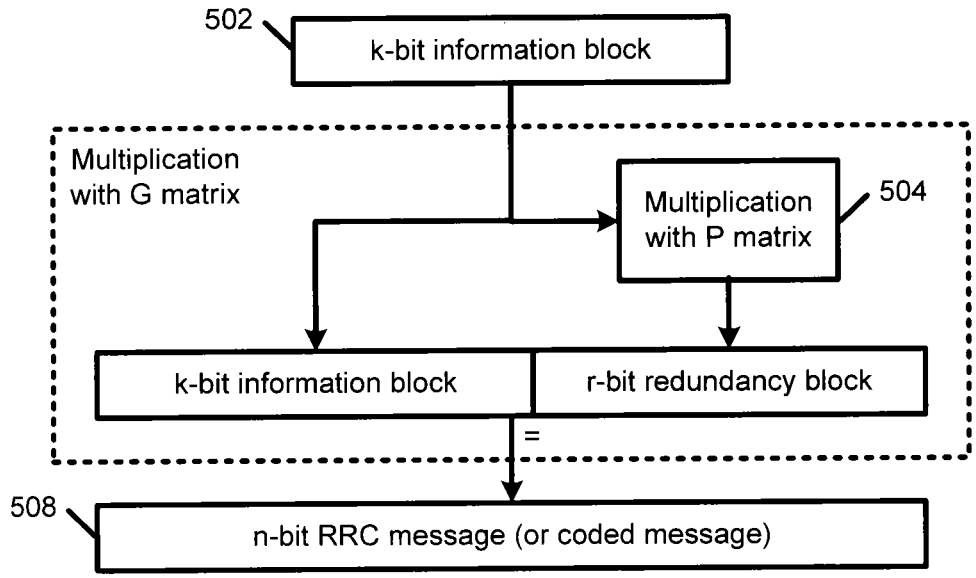
FIG. 5A depicts the format of a retransmission return channel (RRC) message and the encoding process.

FIG. 5A depicts the format of a retransmission return channel (RRC) message and the encoding process. An n-bit RRC message or coded message is formed by k information bits 502 (which contain actual information relative to which DTU has been correctly or incorrectly received) and r=n−k redundancy bits that contain no new information and that are a linear combination of the information bits. The code used to generate the message is characterized as being "systematic," since the coded message 508 contains the original (unmodified) k information bits 502. The original information 502 can be recovered from the coded message 508 by simply truncating the first k bits of the coded message. The request transmitter located in the receiver block 110 may encode a n-bit RRC message by performing a matrix multiplication 504 between the uncoded k-bit message and a k*n generator matrix G=[$I_k$ P], where $I_k$ is the k*k identity matrix and P is the k*r matrix that determines the redundancy bits. In the current xDSL standard, a RRC message is sent in each DMT symbol, where the n-bits forming the message are the first bits to be sent to the TCM encoder.

Figure 5B:
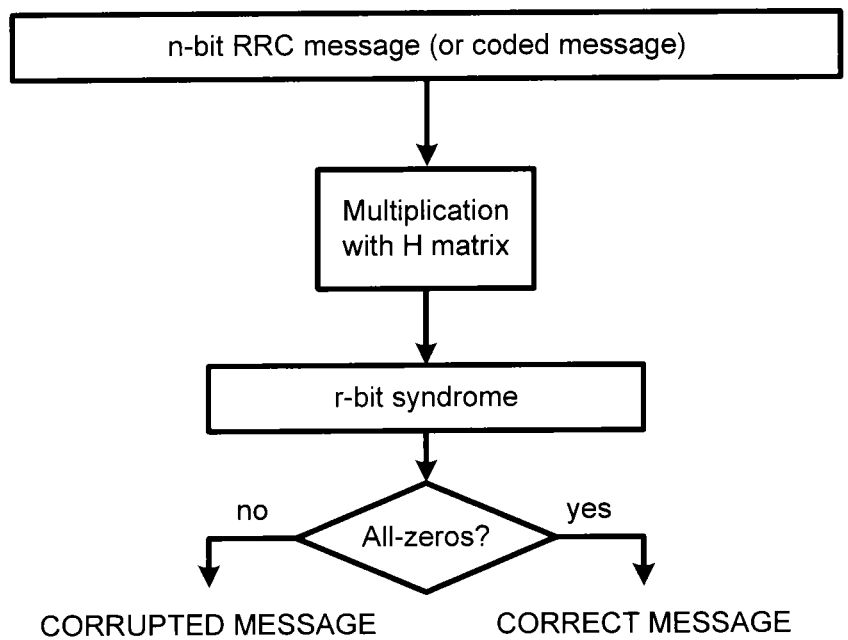
FIG. 5B depicts the format of a retransmission return channel (RRC) message and the detection process.

FIG. 5B depicts the format of a retransmission return channel (RRC) message and the detection process. The RRC receiver 110 may detect corrupted RRC messages by checking for a non-zero syndrome, where the syndrome may be computed by matrix multiplication of received message with the n*r parity check matrix H=[$P^T$ $I_r$]$^T$, where the notation $^T$ denotes the transpose operator. The values of n and k proposed so far for current standard xDSL (ADSL and VDSL) systems are k=12 and n=24. But the following concepts can be extended to any values of n and k, for n>k. So far, a proposed method for performing xDSL encoding on the RRC message is directed to using (n=24, k=12) extended Golay code or a (n=24, k=12) systematic code whose redundancy part can be generated with a 12-bit cyclic redundancy check code (CRC-12) applied to the information bits. For example, the P matrix for a CRC-12 with generator polynomials $x^{12}$+$x^{11}$+$x^3$+$x^2$+x+1 is given by the following:

$$P = \begin{bmatrix} 1 & 0 & 0 & 0 & 0 & 0 & 0 & 1 & 1 & 1 & 1 \\ 1 & 0 & 0 & 0 & 0 & 0 & 1 & 0 & 0 & 0 & 1 \\ 1 & 0 & 0 & 0 & 0 & 1 & 0 & 1 & 1 & 0 & 1 \\ 1 & 0 & 0 & 0 & 1 & 0 & 1 & 0 & 1 & 0 & 1 \\ 1 & 0 & 0 & 1 & 0 & 1 & 0 & 0 & 1 & 0 & 1 \\ 1 & 0 & 0 & 1 & 0 & 1 & 0 & 0 & 0 & 1 & 0 \\ 1 & 0 & 1 & 0 & 1 & 0 & 0 & 0 & 0 & 0 & 1 \\ 1 & 0 & 1 & 0 & 1 & 0 & 0 & 0 & 0 & 1 & 0 \\ 0 & 0 & 1 & 0 & 0 & 0 & 0 & 0 & 1 & 0 & 1 \\ 0 & 1 & 0 & 0 & 0 & 0 & 0 & 1 & 0 & 1 & 0 \\ 1 & 0 & 0 & 0 & 0 & 0 & 1 & 0 & 1 & 0 & 0 \\ 1 & 0 & 0 & 0 & 0 & 1 & 0 & 0 & 1 & 1 & 1 \end{bmatrix} \quad (1)$$

For example, a (24, 12) extended Golay code may be implemented with the following matrix:

$$P = \begin{bmatrix} 1 & 1 & 0 & 1 & 1 & 1 & 0 & 0 & 0 & 1 & 0 & 1 \\ 1 & 0 & 1 & 1 & 1 & 0 & 0 & 0 & 1 & 0 & 1 & 1 \\ 0 & 1 & 1 & 1 & 0 & 0 & 0 & 1 & 0 & 1 & 1 & 1 \\ 1 & 1 & 1 & 0 & 0 & 0 & 1 & 0 & 1 & 1 & 0 & 1 \\ 1 & 1 & 0 & 0 & 0 & 1 & 0 & 1 & 1 & 0 & 1 & 1 \\ 1 & 0 & 0 & 0 & 1 & 0 & 1 & 1 & 0 & 1 & 1 & 1 \\ 0 & 0 & 0 & 1 & 0 & 1 & 1 & 0 & 1 & 1 & 1 & 1 \\ 0 & 0 & 1 & 0 & 1 & 1 & 0 & 1 & 1 & 1 & 0 & 1 \\ 0 & 1 & 0 & 1 & 1 & 0 & 1 & 1 & 1 & 0 & 0 & 1 \\ 1 & 0 & 1 & 1 & 0 & 1 & 1 & 1 & 0 & 0 & 0 & 1 \\ 0 & 1 & 1 & 0 & 1 & 1 & 1 & 0 & 0 & 0 & 1 & 1 \\ 1 & 1 & 1 & 1 & 1 & 1 & 1 & 1 & 1 & 1 & 1 & 0 \end{bmatrix} \quad (2)$$

One approach comprises a theoretical comparison of the detection performance of cyclic redundancy check (CRC) versus that of block codes. Binary (n,k) block codes are roughly equivalent to a CRC-(n−k) when examined from the standpoint of trade-off between bandwidth efficiency and detection performance.

More practical results on the detection performance of a CRC-12 and the (24, 12) extended Golay code are now described. Specifically, detection performance results obtained via Monte-Carlo simulation are discussed along with results obtained with a retransmission scheme emulated in Matlab/C. A study of the misdetection probability of an r-bit CRC (also referred as CRC-r) and an (n, k) binary block code was performed, and the study assumed uniformly distributed (i.e., each of the possible $2^n$ combinations of n-bit noise pattern has a probability $2^{-n}$) error pattern and concluded that both CRC and block code have a misdetection probability:

$$P_{mis} \sim 2^{-r} (=2.44e-4 \text{ for } r=12 \text{ bits}) \quad (3)$$

In practice, however, the error patterns experienced by the RRC are generally not uniformly distributed. These error patterns depend mainly on the noise on the line (impulse power relative to stationary noise), the inner code (whether TCM is used or not) and the constellation mapping. Monte-Carlo simulation results obtained with a system emulated in Matlab/C are described. With the Monte-Carlo simulations, the misdetection probabilities of CRC with generator polynomial $x^{12}$+$x^{11}$+$x^3$+$x^2$+x+1 and extended (24, 12) Golay cod were calculated in the different simulation setups.

The simulation setup comprised a DMT symbol formed by 24 tones loaded with the same constellation. DMT symbols were either loaded with all QPSKs (small size constellations), all 7-bit QAMs (medium size constellations), or all 12-bit QAM (large size constellations). Standard 16-state Wei TCM enabled was used. Finally, impulse noise was emulated by applying a background AWGN of power equal to the loading SNR for $10^{-7}$ BER (including TCM coding gain) increased by an ImpulseNoisePower varying from 4 to 24 dB by step of 10 dB.

The results are shown below where Tables 1 and 2 provide the number Y of corrupted RRCs received and the number X of misdetections, as well as the misdetection rate Z=X/Y. In the tables below, the following notation is used: 'X in Y→Z'. This represents X misdetections that occurred in Y corrupted received RRC messages that led to a misdetection rate Z.

TABLE 1

Simulated misdetection probability for CRC-12

| | ImpulseNoisePower | | |
|---|---|---|---|
| | 4 dB | 14 dB | 24 dB |
| QPSK | 100 in 2.1 · 10$^5$ → 4.7 · 10$^{-4}$ | 252 in 8.2 · 10$^5$ → 3.1 · 10$^{-4}$ | 178 in 7.3 · 10$^5$ → 2.4 · 10$^{-4}$ |
| 7-bit QAM | 6 in 2 · 10$^5$ → 3 · 10$^{-5}$ | 110 in 3.5 · 10$^5$ → 3.1 · 10$^{-4}$ | 62 in 2.7 · 10$^5$ → 2.3 · 10$^{-4}$ |
| 12-bit QAM | 0 in 8 · 10$^6$ → 0 | 43 in 8 · 10$^6$ → 5.4 · 10$^{-6}$ | 29 in 3 · 10$^5$ → 9.7 · 10$^{-5}$ |

TABLE 2

Simulated misdetection probability for (24, 12) Golay code

| | ImpulseNoisePower | | |
|---|---|---|---|
| | 4 dB | 14 dB | 24 dB |
| QPSK | 7 in 2.1 · 10$^5$ → 3.3 · 10$^{-5}$ | 175 in 8.2 · 10$^5$ → 2.1 · 10$^{-4}$ | 185 in 7.3 · 10$^5$ → 2.5 · 10$^{-4}$ |
| 7-bit QAM | 2 in 2 · 10$^5$ → 1 · 10$^{-5}$ | 55 in 3.5 · 10$^5$ → 1.6 · 10$^{-4}$ | 61 in 2.7 · 10$^5$ → 2.3 · 10$^{-4}$ |
| 12-bit QAM | 8 in 8 · 10$^6$ → 1 · 10$^{-6}$ | 211 in 8 · 10$^6$ → 2.6 · 10$^{-5}$ | 42 in 3 · 10$^5$ → 1.4 · 10$^{-4}$ |

As shown in the simulation results above, the performance associated with using the Golay code and CRC-12 varies. In general, the Golay code performs better when the RRC is mapped on small or medium-sized constellations. This is not unexpected because due to its Hamming weight distribution and particularly, the increased minimum Hamming distance, the Golay code is expected to perform better in the presence of random-like errors. In general, the CRC performs better when the RRC is mapped on large constellations. For large constellations, errors are more likely to be grouped into bursts, and hence are more likely to be detected with the CRC. Additionally, both techniques exhibit similar performance. Both techniques converge toward the theoretical performance in Equation (3) when the noise power increases, and hence become more similar in high-power impulse noise environments. Also, both techniques experience a decrease in the misdetection probability when the impulse noise power decreases.

The reason the CRC-12 ($x^{12}+x^{11}+x^3+x^2+x+1$) exhibits better performance as the constellation size increases is that the error patterns seen by the RRC message are less random (i.e., are more bursty) due to path selection in the inner code (TCM) trellis combined with the QAM constellation mapping. Therefore, in this situation, use of the CRC-12 is more appropriate. In this regard, the Golay code and CRC-12 exhibit different performance, depending on the noise power and the bit-loading. Furthermore, the lowest misdetection probability rates were obtained with a CRC-12 by loading the RRC message on large constellations (typically 12-bits or larger size). Therefore, the misdetection probability of the Golay code can be matched or even improved by using a CRC-12 and ensuring that the RRC message is loaded on a pair of tones comprising 12 or more bits.

In view of the foregoing, various embodiments are directed to a RRC receiver 110 configured to select the redundancy technique (i.e., a P matrix) that more effectively reduces the misdetection probability according to the system setup, which mainly comprises the bit-loading associated with the modulated RRC message, and the noise environment in terms of the expected impulse noise power. In other embodiments, the selection of the redundancy technique can be done by the RRC transmitter 102 following prior information exchange of the configuration of the receiver—in particular, after exchange of the bit-loading information on which the RRC will be mapped/demapped.

Note that for some system configurations (bit-loading, impulse noise power, inner coding, etc.), neither the previously defined Golay nor CRC-12 as previously defined appears to be the optimum coding technique to minimize the misdetection probability. Various embodiments are proposed that incorporate a different P matrix that minimizes the misdetection probability. In order to extend the number of possible codes for the RRC message error detection mechanism to codes other than the two codes described above (i.e., Golay code or CRC-12), an expansion of the possible choice of systematic linear block codes where the generator matrix can be expressed in the form G=[$I_k$ P] is now described.

Various embodiments are described that utilize rate ½ (i.e., r=k) (24, 12) codes. Specifically, various embodiments are directed to utilizing a linear block code P matrix determined by a RRC channel receiver 102 and communicated to the RRC transmitter 110 during an initialization phase. In other embodiments, a RRC transmitter 110 determines the P matrix based on information relating to the receiver configuration exchanged during an initialization phase. One perceived shortcoming with the approaches described earlier is that the previously determined P matrices do not systematically minimize the misdetection probability. To this end, various embodiments are directed to incorporating alternative P matrices obtained by permuting columns of the P matrix (2) described earlier.

Generally, the misdetection performance of a code depends on its Euclidean distance spectrum, that is, the distribution of the misdetection points in the Euclidean space. A misdetection point is a multi-dimensional QAM signal that is different than the transmitted one and that will lead to the all-zero syndrome when decoded at the receiver side. In this case, the all-zero syndrome leads to a misdetection. Based on the Euclidean distance spectrum, the misdetection probability can be upper-bounded by the union bound as is expressed as follows:

$$P_{mis} <= \Sigma_\delta A_\delta * Q(\text{sqrt}(\delta/\sigma^2/E_{av})) \quad (4)$$

where δ represents the squared Euclidean distance between signals in the odd integer lattice (square lattice with points only at odd coordinates), $A_\delta$ is the number of couples {transmitted signal, misdetection signals} that are distant by the square distance δ, $E_{av}$ is the average energy of the constellation mapping the codeword, and $\sigma^2$ is the noise variance. The Q function ties the Euclidean distance and the actual misdetection probability.

The table below shows the smallest multiplicities of the Euclidean distance spectrum of the code described above mapped to the standard 12*13 bits TCM coded 4D QAM.

TABLE 3

Euclidean distance spectrum of the Golay code with P matrix (2)

| δ | 16 | 24 | 32 | 40 | 48 | 56 | 64 | 72 | 80 | 88 | 96 | 104 |
|---|---|---|---|---|---|---|---|---|---|---|---|---|
| $A_\delta$ | 0 | 48 | 0 | 0 | 26 | 98 | 256 | 56 | 60 | 436 | 0 | 52 |

The codeword is mapped on this constellation because the 12*13 bits 4D-QAM is the smallest constellation size formed by the smallest component 2D-QAM constellations that allows mapping of the 24-bit RRC message on the smallest number of tones (i.e., 2). Note that the benefit is twofold.

First, smaller constellations are less sensitive to noise. Second, mapping to a smaller number of tones, and especially only 2 tones, reduces the TCM decoder output error probability because the RRC is mapped to the first section of the TCM code trellis. The first section of the TCM code trellis is less likely to generate errors because the starting TCM trellis state is known (i.e., equals zero). Information regarding the starting state aids in the decision process by the TOM decoder (based on the Viterbi algorithm) by reducing the number of possible trellis branches to search.

Mapping the full RRC message to the first section of the inner code trellis eliminates some possible error patterns that corrupt the RRC message, thereby reducing the RRC message error probability. Reducing the RRC error probability reduces the chances of misdetection, thereby improving the overall detection performance. Robustness to errors can also be improved by modulating the RRC message to tones with a signal-to-noise ratio (SNR) higher than a minimum necessary SNR required to guarantee the targeted error rate of the RRC message. In DSL, the minimum necessary SNR must guarantee a target Bit Error Rate of 10 E-7 By fixing the constellation as proposed above, the resulting reduced space of error patterns may in turn lead to the derivation of specific optimized P matrices minimizing the misdetection probability.

A Golay code with an alternative P matrix provides better performance in a low noise power scenario. The Q function referred in Equation (4) is a rapidly decreasing function. As a consequence, the misdetection probability depends more on the smallest distances $\delta$ and associate multiplicities $A_\delta$. With a high signal-to-noise ratio (i.e., a low noise power), the misdetection probability mostly depends on the minimum squared Euclidean distance $\delta_{min}$ between misdetection points and its associate multiplicity $A_{\delta min}$. Therefore, various embodiments are directed to maximizing the minimum Euclidean distance as a criterion for optimizing a code for low noise power scenarios.

With a minimum squared Euclidean distance $\delta_{min}=24$, note that the Golay code with the P matrix (2) described earlier does not provide optimum performance. For example, the Golay code with the P matrix $$P = \begin{bmatrix} 1 & 0 & 1 & 1 & 1 & 0 & 1 & 1 & 1 & 0 & 0 & 0 \\ 1 & 1 & 0 & 1 & 1 & 1 & 1 & 0 & 0 & 0 & 1 & 0 \\ 1 & 1 & 0 & 1 & 0 & 1 & 0 & 1 & 1 & 1 & 0 & 0 \\ 0 & 0 & 0 & 1 & 0 & 1 & 1 & 1 & 1 & 0 & 1 & 1 \\ 0 & 1 & 1 & 1 & 0 & 0 & 1 & 0 & 1 & 1 & 1 & 0 \\ 0 & 1 & 0 & 1 & 1 & 0 & 1 & 1 & 0 & 1 & 0 & 1 \\ 1 & 1 & 1 & 1 & 0 & 0 & 0 & 1 & 0 & 0 & 1 & 1 \\ 0 & 0 & 1 & 1 & 1 & 1 & 0 & 1 & 0 & 1 & 1 & 0 \\ 1 & 0 & 0 & 1 & 1 & 0 & 0 & 0 & 1 & 1 & 1 & 1 \\ 1 & 0 & 1 & 1 & 0 & 1 & 1 & 0 & 0 & 1 & 0 & 1 \\ 0 & 1 & 1 & 1 & 1 & 1 & 0 & 0 & 1 & 0 & 0 & 1 \\ 1 & 1 & 1 & 0 & 1 & 1 & 1 & 1 & 1 & 1 & 1 & 1 \end{bmatrix} \quad (5)$$

leads to a minimum squared Euclidean distance $\delta_{min}=40$ (cf. Euclidean distance spectrum in Table 2).

TABLE 4

Euclidean distance spectrum of the Golay code with P matrix (5)

| $\delta$ | 16 | 24 | 32 | 40 | 48 | 56 | 64 | 72 | 80 | 88 | 96 | 104 |
|---|---|---|---|---|---|---|---|---|---|---|---|---|
| $A_\delta$ | 0 | 0 | 0 | 10 | 0 | 280 | 264 | 20 | 6 | 424 | 0 | 116 |

With medium-range SNRs or medium noise levels, the misdetection probability depends not only on the minimum squared Euclidean distance $\delta_{min}$ and its associate multiplicity $A_{\delta min}$, but also on the next distances as well as the number of multiplicities associated with small distances. For this range of SNRs, various embodiments incorporate a code having a reduced total number of multiplicities associated with small distances than just a large minimum distance. For example, the Golay code with the P matrix below $$P = \begin{bmatrix} 0 & 1 & 1 & 0 & 1 & 0 & 0 & 1 & 1 & 0 & 1 & 1 \\ 0 & 0 & 0 & 0 & 1 & 1 & 1 & 0 & 1 & 1 & 1 & 1 \\ 1 & 1 & 1 & 0 & 1 & 1 & 1 & 0 & 1 & 0 & 0 & 0 \\ 0 & 1 & 1 & 1 & 0 & 1 & 0 & 0 & 1 & 1 & 0 & 1 \\ 1 & 1 & 0 & 0 & 0 & 0 & 1 & 1 & 1 & 1 & 0 & 1 \\ 1 & 0 & 1 & 1 & 0 & 0 & 1 & 0 & 1 & 0 & 1 & 1 \\ 0 & 0 & 1 & 1 & 1 & 0 & 1 & 1 & 1 & 1 & 0 & 0 \\ 1 & 0 & 1 & 0 & 0 & 1 & 0 & 1 & 1 & 1 & 1 & 0 \\ 1 & 1 & 0 & 1 & 1 & 0 & 0 & 0 & 1 & 1 & 1 & 0 \\ 1 & 0 & 0 & 1 & 1 & 1 & 0 & 1 & 1 & 0 & 0 & 1 \\ 0 & 1 & 0 & 1 & 0 & 1 & 1 & 1 & 1 & 0 & 1 & 0 \\ 1 & 1 & 1 & 1 & 1 & 1 & 1 & 0 & 1 & 1 & 1 \end{bmatrix} \quad (6)$$

outperforms the code with the P matrix (5) in the range of medium SNRs. As seen in Table 5, for P matrix (6), there is only 208 misdetection points located at a squared Euclidean distance smaller than 104, as compared to 1120 points for the matrix (5).

TABLE 5

Euclidean distance spectrum of the Golay code with P matrix (6)

| $\delta$ | 16 | 24 | 32 | 40 | 48 | 56 | 64 | 72 | 80 | 88 | 96 | 104 |
|---|---|---|---|---|---|---|---|---|---|---|---|---|
| $A_\delta$ | 4 | 0 | 0 | 0 | 2 | 0 | 0 | 22 | 104 | 46 | 4 | 26 |

For high power noise, it can be assumed that all misdetection points are equiprobable, thereby leading to uniformly distributed error patterns. Each of the possible $2^n$ combinations of n-bit noise pattern has a probability $2^{-n}$. This leads to the misdetection probability $$P_{min} \sim 2^{-12} = 2.44e-4 \quad (7)$$

To illustrate the concepts described above, Monte-Carlo simulation results are now discussed. The misdetection probabilities of the Golay code with various P matrices were calculated by Monte-Carlo simulation in the different simulation setups. In one setup, the 24-bit message (becoming 25 bits after TCM encoding) was mapped to 12*13 bits 4D-QAM constellations. DMT symbols are formed by 24 tones loaded with the same 12*13 bits 4D-QAM constellations. Standard 16-state Wei TCM is used. Impulse noise was emulated by applying a background AWGN of power equal to the loading SNR for $10^{-7}$ BER (including TCM coding gain) increased by an ImpulseNoisePower varying from 4 to 24 dB by step of 10 dB.

Table 6 provides the number Y of corrupted codewords received and the number X of misdetections, as well as the misdetection rate Z=X/Y. In the tables, the notation 'X in Y→Z' represents X misdetections that occurred in Y corrupted received RRC messages leading to a misdetection rate Z.

TABLE 6

Simulated misdetection probability for Golay code with various P matrices

|  | ImpulseNoisePower | | |
| --- | --- | --- | --- |
|  | 4 dB | 14 dB | 24 dB |
| P matrix (2) | 8 in $8 \cdot 10^6 \rightarrow$ $1 \cdot 10^{-6}$ | 211 in $8 \cdot 10^6$ $\rightarrow 2.6 \cdot 10^{-5}$ | 42 in $3 \cdot 10^5 \rightarrow$ $1.4 \cdot 10^{-4}$ |

It should be emphasized that while the P matrix given in Equation (2) is optimal in terms of Hamming distance properties, it is not optimal in terms of Euclidean distance properties. The Euclidean distance properties of the Golay code with the generator matrix G based on the P matrix given in equation (2) can be altered by permuting the redundancy bits obtained by multiplication of message and the matrix G. This operation does not change the code Hamming distance properties. An equivalent result can be obtained by permuting the columns of the Golay P matrix. Experimentally, the minimum squared Euclidean distance $\delta_{min}$ can be calculated for all 12! permutations of the columns of the Golay matrix given in equation (2). The maximum $\delta_{min}$ was found by applying the permutation operation (12 4 7 2 1 11 10 6 3 8 9 5) to the columns of the Golay matrix. The resultant Golay matrix is given by equation (8).

$$P = \begin{bmatrix} 1 & 0 & 1 & 1 & 1 & 0 & 1 & 1 & 0 & 1 & 0 & 0 \\ 1 & 0 & 1 & 1 & 0 & 1 & 0 & 0 & 1 & 1 & 1 & 0 \\ 0 & 1 & 1 & 1 & 1 & 0 & 0 & 1 & 1 & 0 & 1 & 0 \\ 0 & 1 & 1 & 1 & 0 & 0 & 1 & 0 & 1 & 1 & 0 & 1 \\ 0 & 1 & 0 & 0 & 0 & 1 & 0 & 1 & 1 & 1 & 1 & 1 \\ 1 & 1 & 0 & 1 & 1 & 0 & 0 & 0 & 0 & 1 & 1 & 1 \\ 1 & 0 & 0 & 1 & 0 & 0 & 1 & 1 & 1 & 0 & 1 & 1 \\ 1 & 1 & 1 & 0 & 0 & 1 & 1 & 1 & 1 & 0 & 0 & 0 \\ 0 & 1 & 0 & 1 & 1 & 1 & 1 & 1 & 0 & 0 & 0 & 1 \\ 1 & 0 & 0 & 0 & 1 & 1 & 1 & 0 & 1 & 1 & 0 & 1 \\ 0 & 1 & 1 & 0 & 1 & 1 & 1 & 0 & 0 & 1 & 1 & 0 \\ 1 & 0 & 1 & 0 & 1 & 1 & 0 & 1 & 0 & 0 & 1 & 1 \end{bmatrix} \quad (8)$$

The P matrix (8) in the equation above yields the same Hamming distance property than the Golay matrix shown in Equation (2), but yields improved Euclidean distance properties. The optimized P matrix yields a minimum squared Euclidean distance $\delta_{min}=112$. By comparison, the Golay matrix of equation (2) so far yields a minimum Euclidean distance of $\delta_{min}=24$, where minimum squared Euclidean distance computation assumes 12*13 bits 4D-QAM constellations and 1 TCM redundancy bit per 4D QAM signal.

Figure 6:
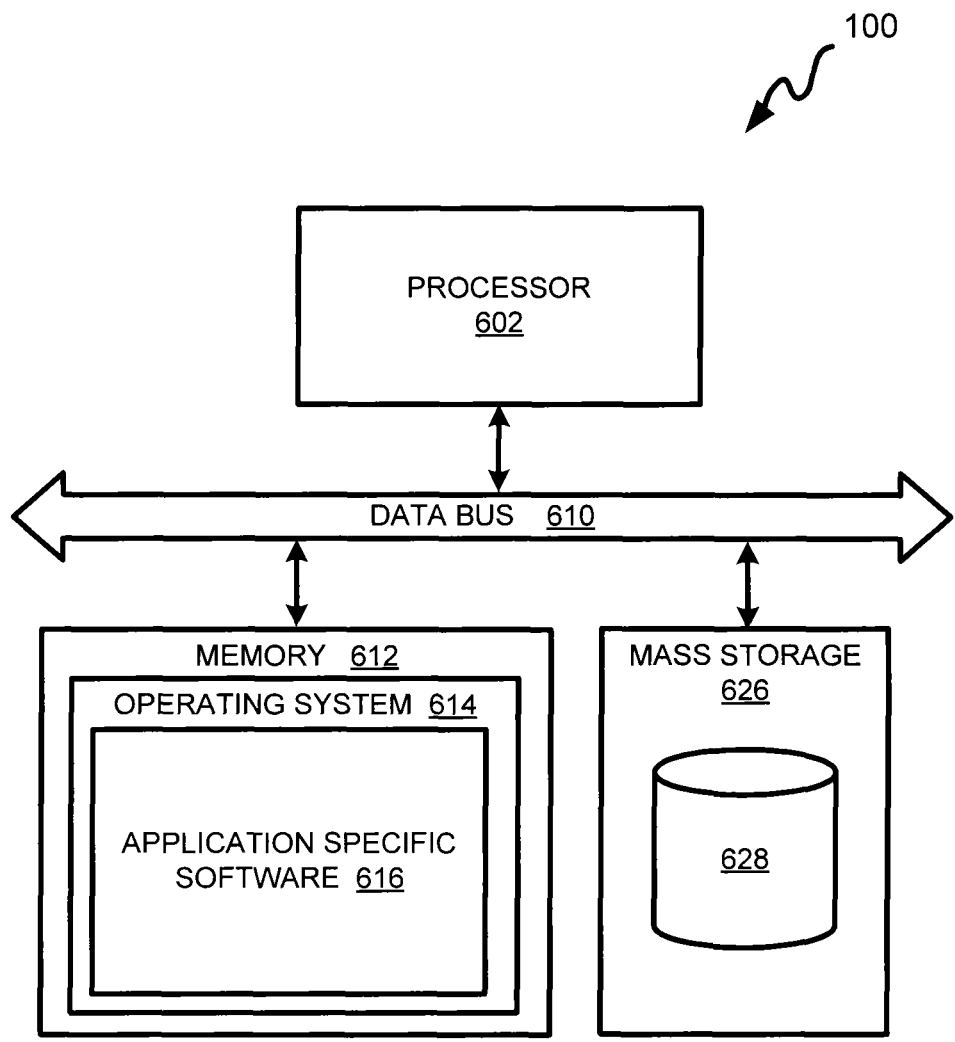
FIG. 6 illustrates an embodiment of an apparatus for executing the various components shown in FIG. 1.

FIG. 6 illustrates an embodiment of an apparatus for executing the various components shown in FIG. 1. Generally speaking, the various embodiments for performing retransmission return channel error detection may be implemented in any one of a number of computing devices. Irrespective of its specific arrangement, the retransmission system 100 in FIG. 1 may comprise memory 612, a processor 602, and mass storage 626, wherein each of these devices are connected across a data bus 610.

The processor 602 may include any custom made or commercially available processor, a central processing unit (CPU) or an auxiliary processor among several processors associated with the retransmission system 100, a semiconductor based microprocessor (in the form of a microchip), one or more application specific integrated circuits (ASICs), a plurality of suitably configured digital logic gates, and other well known electrical configurations comprising discrete elements both individually and in various combinations to coordinate the overall operation of the computing system.

The memory 612 can include any one or a combination of volatile memory elements (e.g., random-access memory (RAM, such as DRAM, and SRAM, etc.)) and nonvolatile memory elements (e.g., ROM, hard drive, CDROM, etc.). The memory 612 typically comprises a native operating system 614, one or more native applications, emulation systems, or emulated applications for any of a variety of operating systems and/or emulated hardware platforms, emulated operating systems, etc. For example, the applications may include application specific software 616 stored on a computer readable medium and executed by the processor 602 and may include any of the components described with respect to FIGS. 1 and 2. One of ordinary skill in the art will appreciate that the memory 612 can, and typically will, comprise other components which have been omitted for purposes of brevity. It should be noted, however, that the various components in FIGS. 1 and 2 may also be embodied as hardware.

Where any of the components described above comprises software or code, these components are embodied in a computer-readable medium for use by or in connection with an instruction execution system such as, for example, a processor in a computer system or other system. In the context of the present disclosure, a computer-readable medium refers to any tangible medium that can contain, store, or maintain the software or code for use by or in connection with an instruction execution system. For example, a computer-readable medium may store one or more programs for execution by the processing device 602 described above.

More specific examples of the computer-readable medium may include a portable computer diskette, a random access memory (RAM), a read-only memory (ROM), an erasable programmable read-only memory (EPROM, EEPROM, or Flash memory), and a portable compact disc read-only memory (CDROM). As shown in FIG. 6, the retransmission system 100 may further comprise mass storage 626. For some embodiments, the mass storage 626 may include a database 628 for storing and managing data, such as bit-loading tables.

Figure 7:
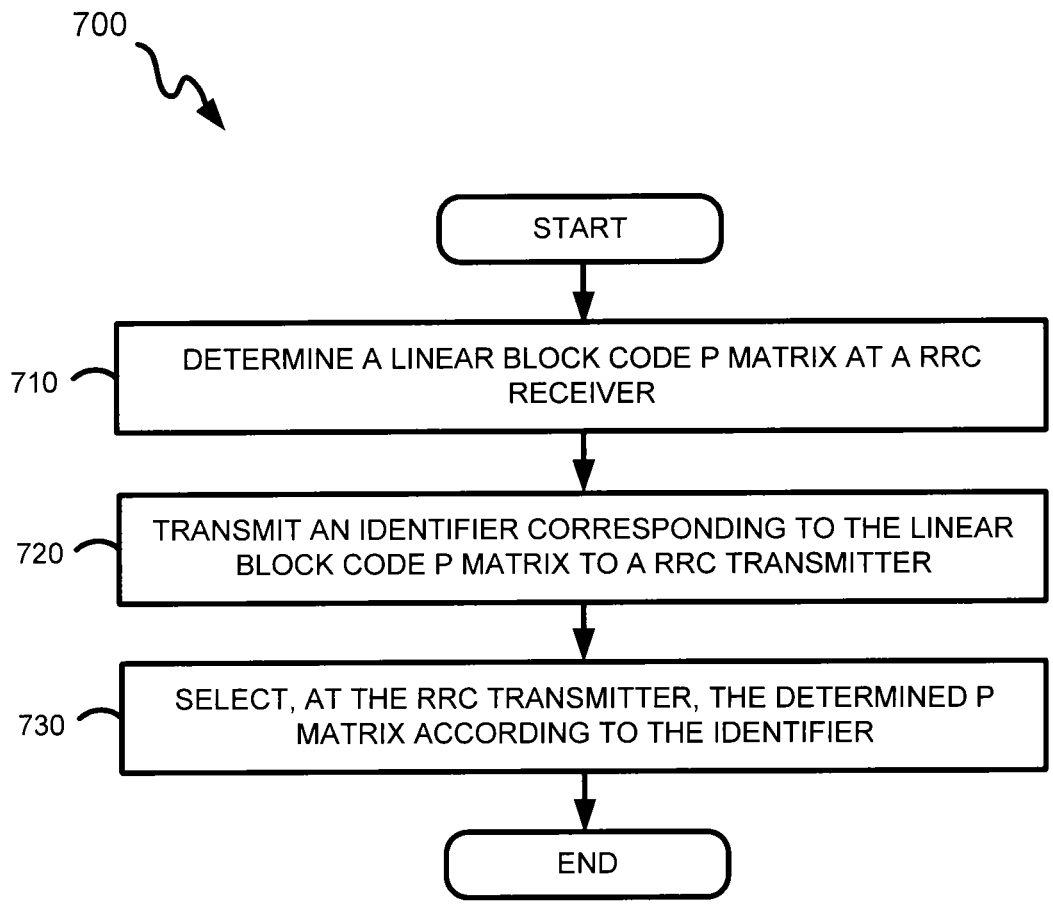
FIG. 7 depicts a top-level flow diagram for an embodiment of a process for performing retransmission return channel error detection in the system of FIG. 1.

FIG. 7 depicts a top-level flow diagram 700 for an embodiment of a process for performing retransmission return channel error detection in the system of FIG. 1. For this embodiment, a method is implemented in a digital subscriber line (DSL) system for performing error detection in a retransmission return channel (RRC) message. The method comprises determining a linear block code P matrix at a RRC receiver (block 710), transmitting an identifier corresponding to the linear block code P matrix to a RRC transmitter (720), and selecting, at the RRC transmitter, the determined P matrix according to the identifier (block 730). For some embodiments, the identifier may contain different information, including but not limited to the row and column entries of the P matrix, the permutation pattern according to a reference P matrix known a priori by the RRC receiver and an index to be used to select the P matrix among a pre-stored table of P matrices.

Figure 8:
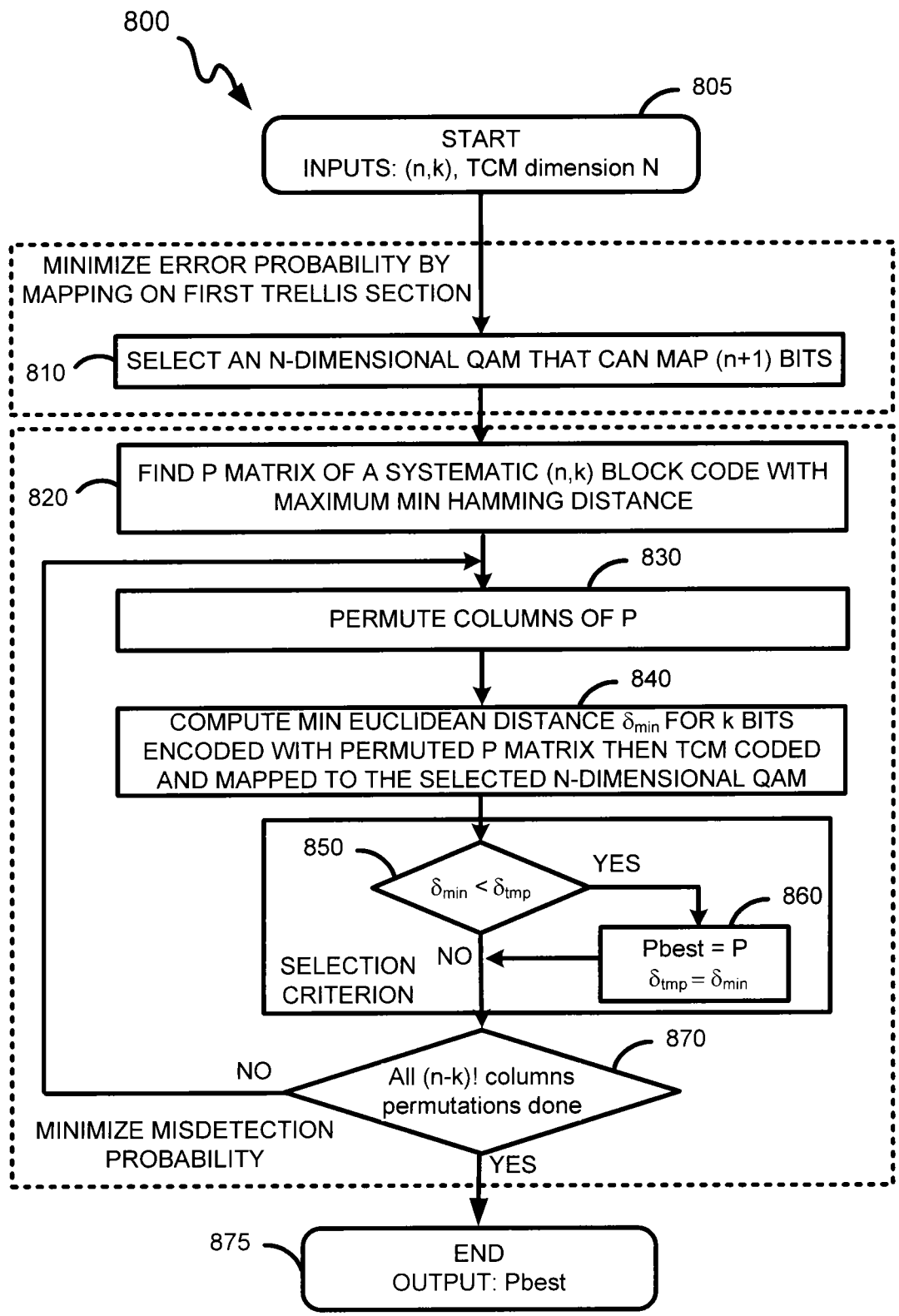
FIG. 8 depicts a flow diagram for an embodiment of a process for determining the linear block code P matrix.

FIG. 8 depicts a flow diagram 800 for an embodiment of a process for determining the linear block code P matrix. The process begins with the input of the RRC message codeword length n and information length k, and the dimension N of the inner TCM (block 805) and is performed in two phases. The first phase comprises selecting a mapping strategy for minimizing the RRC message error probability. The mapping strategy is directed to mapping the RRC message to the first trellis section of the TCM, which involves selecting an N-dimensional QAM constellation that can map n+1 bits (block 810).

The second phase comprises minimizing the misdetection probability of corrupted RRC messages. This second phase comprises first finding a P matrix yielding a code that is optimal in the Hamming space, i.e., with a maximized minimum Hamming distance (block 820). Then, for each possible permutation of the P matrix (block 830), compute the first elements of the Euclidean distance spectrum for a k-bit information message first encoded with the block code based on the permuted P matrix, then TCM coded and mapped to the selected N-dimensional QAM constellation (block 840). The process outputs the permuted P matrix best fitting a selection criterion.

The selection criterion (decision block 850, block 860) in FIG. 8 involves selecting the permutation leading to the largest minimum Euclidean distance. This criterion is best suited for an environment with a high impulse noise to signal power ratio. The criterion may change for environments with medium and low impulse noise to signal power ratio. Another criterion better suited for an environment with a medium range of impulse noise to signal power ratio involves selecting the permutation leading to the smallest total number of multiplicities associated with small distances in the Euclidean distance spectrum. The steps described above, beginning with block 830, are repeated until all (n–k)! (factorial) column permutations are processed (decision block 870). The parameter Pbest is then output (block 875).

Figure 9:
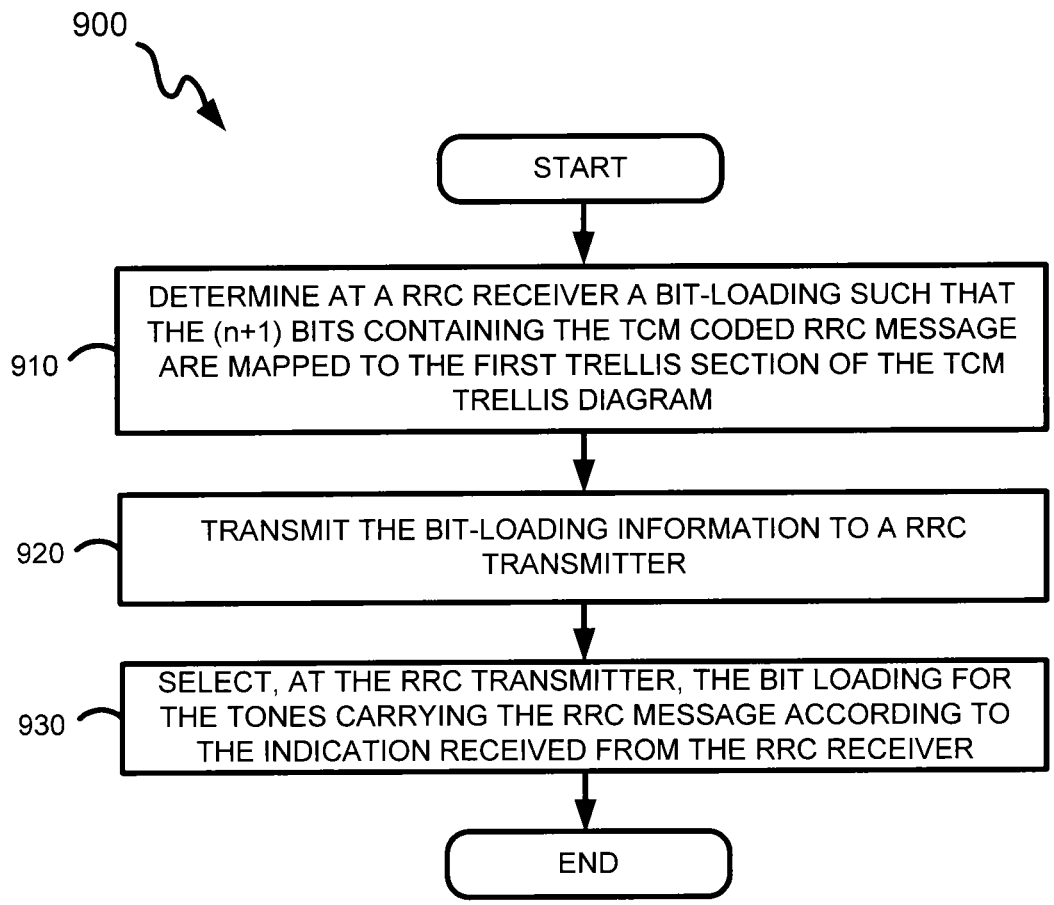
FIG. 9 depicts a flow diagram for an embodiment of a process for performing retransmission return channel error detection in the system of FIG. 1.

FIG. 9 depicts a flow diagram 900 for an embodiment of a process for performing retransmission return channel error detection in the system of FIG. 1. For this embodiment, a method is implemented in a digital subscriber line (DSL) system for performing error detection in a retransmission return channel (RRC) message. The method comprises determining a bit loading at a RRC receiver such that the n+1 bits containing the TCM coded RRC message are mapped to the first trellis section of the TCM trellis diagram (block 910), transmitting the bit loading indication to a RRC transmitter (920), and selecting, at the RRC transmitter, the bit loading for the tones carrying the RRC message according to the indication received from the RRC receiver (block 930).

Figure 10:
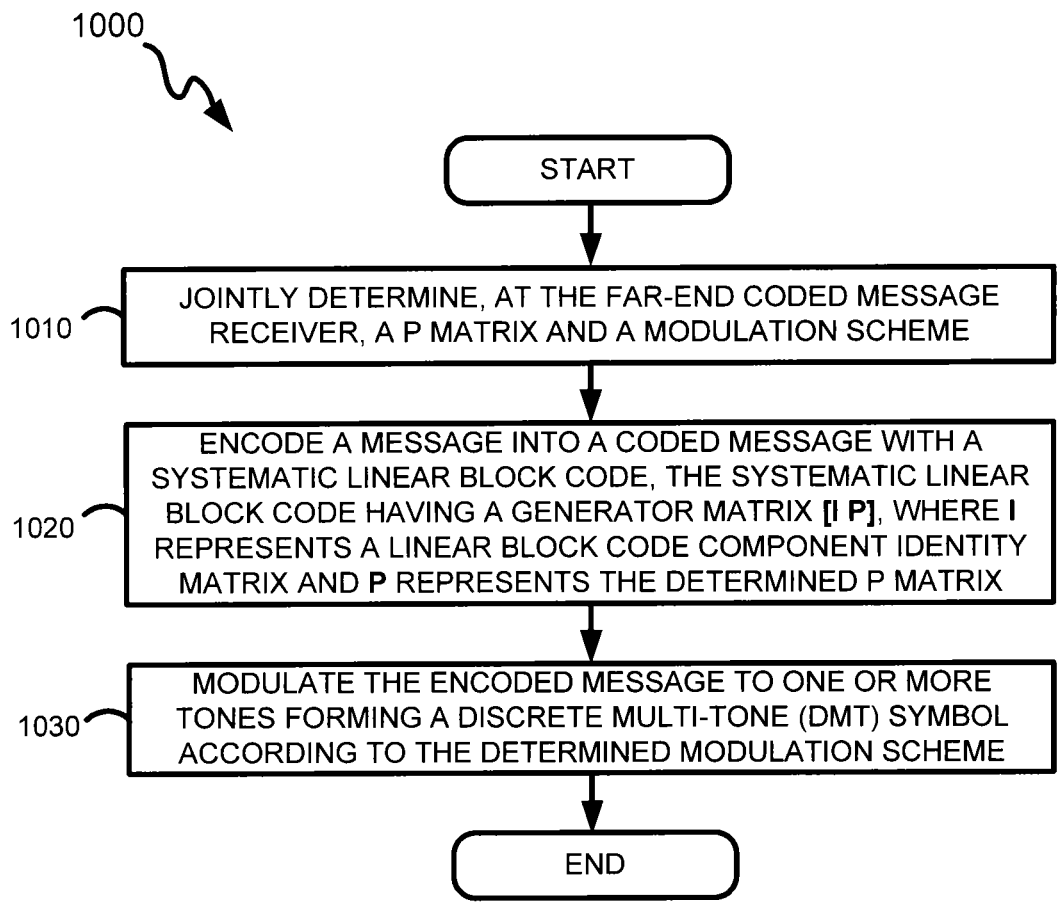
FIG. 10 depicts a flow diagram for another embodiment of a process for performing retransmission return channel error detection in the system of FIG. 1.

FIG. 10 depicts a flow diagram 1000 for another embodiment of a process for performing retransmission return channel error detection in the system of FIG. 1. In accordance with some embodiments, a process is implemented in a digital subscriber line (DSL) system for minimizing a misdetection probability at a far-end coded message receiver during transmission of a coded message. Beginning with block 1010, the method comprises jointly determining, at the far-end coded message receiver, a P matrix and a modulation scheme. The method further comprises encoding a message into a coded message with a systematic linear block code, the systematic linear block code having a generator matrix [I P], where I represents a linear block code component identity matrix and P represents the determined P matrix (block 1020). The method also comprises modulating the encoded message to one or more tones forming a discrete multi-tone (DMT) symbol according to the determined modulation scheme (block 1030).

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

At least the following is claimed:

1. A system comprising:
a transmitter for transmitting a coded message to a far-end coded message receiver, the transmitter comprising:
an encoder configured to encode a message into a coded message having information bits and redundancy bits, the encoder using a generator matrix [I P], where I is an identity matrix that passes the information bits from the message into the encoded message and P represents a matrix that generates the redundancy bits in the encoded message from the information bits in the message; and
a modulator configured to modulate the encoded message to one or more tones forming a discrete multi-tone (DMT) symbol using a modulation scheme comprising a constellation size, wherein the P matrix and the constellation size of the modulation scheme are jointly determined so that the combination of the determined P matrix and constellation size of the modulation scheme together minimize a misdetection probability at the far-end coded message receiver.

2. The system of claim 1, wherein the transmitter is configured to minimize the misdetection probability by selecting the modulation scheme to minimize the message error probability and then selecting the P matrix that maximizes both Hamming and Euclidean minimum distances on the coded message.

3. The system of claim 1, wherein the transmitter is configured to minimize the misdetection probability by first selecting a modulation scheme to minimize the message error probability.

4. The system of claim 3, wherein the message error probability is minimized by modulating the coded message to tones with a signal-to-noise ratio (SNR) higher than the minimum required SNR.

5. The system of claim 3, wherein upon selecting a modulation scheme, the transmitter then selects the P matrix that maximizes a Hamming minimum distance and minimizes multiplicities associated with smallest Euclidean distances of a Euclidean distance spectrum computed for the coded message.

6. The system of claim 1, wherein the linear block code P matrix is communicated by the far-end coded message receiver.

7. The system of claim 1, wherein configuration of the modulator is specified by the far-end message receiver.

8. The system of claim 1, wherein the joint determination of the P matrix and modulation scheme is performed according to a noise environment.

9. The system of claim 7, wherein the configuration of the modulator comprises bit-to-tone loading information.

10. The system of claim 1, wherein the modulator operates based on a trellis coded modulation (TCM) scheme, wherein the message error probability is minimized by modulating the coded message including the TCM redundancy to a first trellis section of a TCM trellis diagram.

11. A system comprising:
a receiver for receiving a coded message from a far-end coded message transmitter, the receiver comprising:
an error detector configured to determine a level of correctness of the received message encoded to include information bits and redundancy bits, the encoding having been performed using a generator matrix [I P], where I is an identity matrix that passes the information bits into the encoded message and P represents a matrix that generates the redundancy bits in the encoded message; and a demodulator configured to demodulate the encoded message from one or more tones forming a discrete multi-tone (DMT) symbol using a demodulation scheme comprising a constellation size; and wherein the receiver is further configured to transmit modulation information associated with the coded message to the far-end message transmitter, and wherein the receiver jointly determines the P matrix and modulation information including the constellation size so that the combination of the determined P matrix and constellation size together minimize a misdetection probability.

12. The system of claim 11, wherein the P matrix is communicated to the far-end coded message transmitter.

13. The system of claim 11, wherein the demodulator comprises a trellis coded modulation (TCM) scheme decoder.

14. The system of claim 13, wherein the receiver minimizes the message error probability by transmitting to the far-end transmitter, modulation information to modulate the coded message including the TCM redundancy to a first trellis section of a TCM trellis diagram.

15. The system of claim 11, wherein the receiver minimizes the message error probability by transmitting to the far-end transmitter, modulation information to modulate the coded message to tones with a signal-to-noise ratio (SNR) higher than the minimum required SNR.

16. The system of claim 11, wherein the receiver minimizes the misdetection probability by first selecting a modulation scheme that minimizes the message error probability.

17. The system of claim 16, wherein upon selecting a modulation scheme, the receiver then selects the P matrix that maximizes both Hamming and Euclidean minimum distances computed for the coded message.

18. The system of claim 16, wherein upon selecting a modulation scheme, the receiver then selects the P matrix that maximizes the Hamming minimum distance and minimizes multiplicities associated with smallest Euclidean distances of a Euclidean distance spectrum computed for the coded message.

19. A system according to claim 1,
wherein the identity matrix I is a 12*12 identity matrix, and wherein the P matrix is:

$$P = \begin{bmatrix} 1 & 0 & 1 & 1 & 1 & 0 & 1 & 1 & 0 & 1 & 0 & 0 \\ 1 & 0 & 1 & 1 & 0 & 1 & 0 & 0 & 1 & 1 & 1 & 0 \\ 0 & 1 & 1 & 1 & 1 & 0 & 0 & 1 & 1 & 0 & 1 & 0 \\ 0 & 1 & 1 & 1 & 0 & 0 & 1 & 0 & 1 & 1 & 0 & 1 \\ 0 & 1 & 0 & 0 & 0 & 1 & 0 & 1 & 1 & 1 & 1 & 1 \\ 1 & 1 & 0 & 1 & 1 & 0 & 0 & 0 & 0 & 1 & 1 & 1 \\ 1 & 0 & 0 & 1 & 0 & 0 & 1 & 1 & 1 & 0 & 1 & 1 \\ 1 & 1 & 1 & 0 & 0 & 1 & 1 & 1 & 1 & 0 & 0 & 0 \\ 0 & 1 & 0 & 1 & 1 & 1 & 1 & 1 & 0 & 0 & 0 & 1 \\ 1 & 0 & 0 & 0 & 1 & 1 & 1 & 0 & 1 & 1 & 0 & 1 \\ 0 & 1 & 1 & 0 & 1 & 1 & 1 & 0 & 0 & 1 & 1 & 0 \\ 1 & 0 & 1 & 0 & 1 & 1 & 0 & 1 & 0 & 0 & 1 & 1 \end{bmatrix}.$$

20. A system according to claim 11,
wherein the identity matrix I is a 12*12 identity matrix, and wherein the P matrix is:

$$P = \begin{bmatrix} 1 & 0 & 1 & 1 & 1 & 0 & 1 & 1 & 0 & 1 & 0 & 0 \\ 1 & 0 & 1 & 1 & 0 & 1 & 0 & 0 & 1 & 1 & 1 & 0 \\ 0 & 1 & 1 & 1 & 1 & 0 & 0 & 1 & 1 & 0 & 1 & 0 \\ 0 & 1 & 1 & 1 & 0 & 0 & 1 & 0 & 1 & 1 & 0 & 1 \\ 0 & 1 & 0 & 0 & 0 & 1 & 0 & 1 & 1 & 1 & 1 & 1 \\ 1 & 1 & 0 & 1 & 1 & 0 & 0 & 0 & 0 & 1 & 1 & 1 \\ 1 & 0 & 0 & 1 & 0 & 0 & 1 & 1 & 1 & 0 & 1 & 1 \\ 1 & 1 & 1 & 0 & 0 & 1 & 1 & 1 & 1 & 0 & 0 & 0 \\ 0 & 1 & 0 & 1 & 1 & 1 & 1 & 1 & 0 & 0 & 0 & 1 \\ 1 & 0 & 0 & 0 & 1 & 1 & 1 & 0 & 1 & 1 & 0 & 1 \\ 0 & 1 & 1 & 0 & 1 & 1 & 1 & 0 & 0 & 1 & 1 & 0 \\ 1 & 0 & 1 & 0 & 1 & 1 & 0 & 1 & 0 & 0 & 1 & 1 \end{bmatrix}.$$

21. A method implemented in a digital subscriber line (DSL) system for minimizing a misdetection probability at a far-end coded message receiver during transmission of a coded message, comprising:

jointly determining, at the far-end coded message receiver, a P matrix and a modulation scheme comprising a constellation size, wherein jointly determining includes determining a combination of P matrix and constellation size that together minimize the misdetection probability;

encoding a message into a coded message having information bits and redundancy bits using a generator matrix [I P], where I is an identity matrix that passes the information bits from the message into the encoded message and P represents the determined P matrix that generates the redundancy bits from the information bits in the message; and modulating the encoded message to one or more tones forming a discrete multi-tone (DMT) symbol according to the determined modulation scheme.

22. The method of claim 21, wherein jointly determining a P matrix and a modulation scheme comprises:

selecting a modulation scheme; and upon selecting the modulation scheme, selecting the P matrix that maximizes both Hamming and Euclidean minimum distances, wherein the minimum Euclidean distance is computed for the coded message.

* * * * *

UNITED STATES PATENT AND TRADEMARK OFFICE
CERTIFICATE OF CORRECTION

Page 1 of 2

PATENT NO. : 8,677,226 B2
APPLICATION NO. : 12/728758
DATED : March 18, 2014
INVENTOR(S) : Pons et al.

It is certified that error appears in the above-identified patent and that said Letters Patent is hereby corrected as shown below:

In the Drawings

In Fig. 6, Sheet 6 of 10, for Tag "628", delete "  " and insert --  --, therefor.

In the Specification

In Column 1, Line 6, delete "APPLICATION" and insert -- APPLICATIONS --, therefor.

In Column 4, Line 14, delete "physical medium specific (PMD)" and insert -- physical medium dependent (PMD) --, therefor.

In Column 5, Lines 12-13, delete "physical medium specific (PMD)" and insert -- physical medium dependent (PMD) --, therefor.

In Column 5, Line 25, delete "RCC," and insert -- RRC, --, therefor.

In Column 8, Line 49, delete "Golay cod" and insert -- Golay code --, therefor.

In Column 9, Line 46, delete "$(x^{12}+x^{11}+x^3+x^{2+}x^+1)$" and insert -- $(x^{12}+x^{11}+x^3+x^2+x+1)$ --, therefor.

In Column 10, Line 21, delete "RRC channel receiver 102" and insert -- RRC channel receiver 110 --, therefor.

In Column 10, Line 22, delete "RRC transmitter 110" and insert -- RRC transmitter 102 --, therefor.

Signed and Sealed this
Sixteenth Day of September, 2014

Michelle K. Lee
*Deputy Director of the United States Patent and Trademark Office*

CERTIFICATE OF CORRECTION (continued)
U.S. Pat. No. 8,677,226 B2

In Column 10, Line 23, delete "RRC transmitter 110" and insert -- RRC transmitter 102 --, therefor.

In Column 11, Line 8, delete "TOM" and insert -- TCM --, therefor.

In Column 14, Line 51, delete "(720)," and insert -- (block 720), --, therefor.

In Column 15, Line 40, delete "(920)," and insert -- (block 920), --, therefor.

In the Claims

In Column 17, Line 42, in Claim 19, delete "A" and insert -- The --, therefor.

In Column 18, Line 1, in Claim 20, delete "A" and insert -- The --, therefor.